(12) United States Patent
Liao et al.

(10) Patent No.: US 7,904,795 B2
(45) Date of Patent: Mar. 8, 2011

(54) ITERATIVE DECODER WITH STOPPING CRITERION GENERATED FROM ERROR LOCATION POLYNOMIAL

(75) Inventors: Yu Liao, Longmont, CO (US); William G. Bliss, Thornton, CO (US); Engling Yeo, San Diego, CA (US)

(73) Assignee: STMicroelectronics, Inc., Coppell, TX (US)

(*) Notice: Subject to any disclaimer, the term of this patent is extended or adjusted under 35 U.S.C. 154(b) by 10 days.

(21) Appl. No.: 12/397,237

(22) Filed: Mar. 3, 2009

(65) Prior Publication Data

US 2009/0282320 A1 Nov. 12, 2009

Related U.S. Application Data

(63) Continuation of application No. 11/257,868, filed on Oct. 25, 2005, now abandoned.

(51) Int. Cl.
*H03M 13/00* (2006.01)
(52) U.S. Cl. .................. 714/784; 714/755; 714/766
(58) Field of Classification Search ............ 714/784, 714/755, 753, 791, 796, 786.755
See application file for complete search history.

(56) References Cited

U.S. PATENT DOCUMENTS

| | | | |
|---|---|---|---|
| 6,879,648 B2 | 4/2005 | Ebel, Sr. et al. | |
| 6,898,254 B2 | 5/2005 | Wolf et al. | |
| 7,043,682 B1 | 5/2006 | Ferguson | |
| 7,092,464 B2 | 8/2006 | Mills | |
| 7,099,411 B1 * | 8/2006 | Wu et al. ............... | 375/341 |
| 7,281,190 B2 | 10/2007 | Souvignier et al. | |
| 7,668,894 B2 * | 2/2010 | Sazegari et al. ............ | 708/270 |

OTHER PUBLICATIONS

Yeo, Engling, Pakzad, Payam, Nikolic, Borivoje, Anantharam, Venkat Iterative Decoding Algorithms for Magnetic Storage Systems, Dept. of Electrical Engineering and Computer Sciences, University of California Berkley, Project Report Jan. 2003, 4 pages.

Bokolamulla, Dhammika, Aulin, Tor, A New Stopping Criterion for Iterative Decoding, IEEE Communications Society, 2004, pp. 538-541.

Bokolamulla, Dhammika, Reduced Complexity Techniques for Interative Decoding, Thesis for the Degree of Licenciate Engineering, Chalmers University of Technology, Goteborg, Sweden, Sep. 2003, pp. i-viii, 1-84.

* cited by examiner

Primary Examiner—Fritz Alphonse
(74) Attorney, Agent, or Firm—Lisa K. Jorgenson; William J. Kubida

(57) ABSTRACT

A decoder for error correction an encoded message, such as one encoded by a turbo encoder, with reduced iterations due to an improved stopping criterion. The decoder includes an error correction loop that iteratively processes a message that is encoded prior to transmittal over a communication channel. The error correction loop generates, such as with a Reed-Solomon decoder, an error location polynomial in each iterative process. A stopping mechanism in the decoder allows an additional iteration of the message decoding based on the error location polynomial, such as by obtaining the degree of the error location polynomial and comparing it to a threshold. In one example, the threshold is the maximum number of symbol errors correctable by the Reed-Solomon code embodied in the decoder. The stopping mechanism allows additional iterations when the stopping criterion (or polynomial degree) is greater than the maximum number of symbol errors correctable by the Reed-Solomon code.

21 Claims, 3 Drawing Sheets

US 7,904,795 B2

ITERATIVE DECODER WITH STOPPING CRITERION GENERATED FROM ERROR LOCATION POLYNOMIAL

RELATED APPLICATION

The present application claims priority from, and is a continuation of, U.S. patent application Ser. No. 11/257,868 filed on Oct. 25, 2005, now abandoned which is hereby incorporated by reference as if fully set forth herein.

BACKGROUND OF THE INVENTION

1. Field of the Invention

The present invention relates, in general, to error correction codes for communication channels such as read channels for hard disk drive (HDD) systems and magneto resistive data storage devices and systems, and, more particularly, to a communication channel with an iterative error correction loop implementing a stopping criterion mechanism that significantly reduces the number of iterations, such as by generating a stopping criterion using the Reed-Solomon error location polynomial that is used to determine whether additional iterations are to be performed.

2. Relevant Background

The demand for improved data storage techniques and systems continues to rapidly grow. Hard disk drives utilizing magneto resistive (MR) heads to read and write data onto one or more spinning magnetic platters or disks are one of the more important and wide spread devices in the data storage industry. Hard disk drives may be used in many applications, including enterprise computer systems, personal computers, set top boxes, audio, video, or television applications, and many other large and small computer devices. Many applications are still being developed, and the uses for hard disk drives are expected to increase.

Hard disk drives store binary encoded information as regions of magnetic flux on a media having a magnetic surface coating. It is desirable that these magnetic regions be encoded on the disk as densely as practical, so that a maximum amount of information may be stored. Disk and tape drive suppliers continue to increase areal densities, or the number of data bits per square inch, to meet the increasing demand for storage at competitive pricing. An ongoing challenge is that the increasing areal density requires the write mechanism to produce smaller recorded patterns which are more difficult for the read mechanism (or read channel) to read and decode without (or with acceptable) error.

More generally, error-correcting codes are often used in the communication or transfer of digital information over noisy (or error producing) channels, such as may be found in hard disk drives, compact disc systems, computer memories, and the like. For example, a message may first be given by a source to an encoder that turns the message into a codeword, i.e., a string of letters from some alphabet, chosen according to the code used (such as a Reed-Solomon (RS) code. The encoded message is then sent through the channel where it may be subjected to noise and, as a result, altered. For example, in a hard disk drive, digital information is encoded prior to writing on a disk surface and is then read in the encoded form, with some noise being experienced in the "channel" that includes the disk, the read/write heads, and transmission media. When this message is read or received at a decoder belonging to a receiver, it is decoded and as necessary, corrected for introduced errors with an error-correcting code.

A present challenge in decoding is how best to accurately decode messages while controlling the complexity and space for corresponding hardware. For example, an error-correcting code that requires numerous iterations may be undesirable as requiring excessive real estate on as integrated circuit (IC) or reconfigurable system-on-chip to implement. Turbo codes have been developed that provide a system of parallel concatenated recursive convolutional error-correction codes that are separated by random interleavers (i.e., devices that output a permuted version of its input symbols) in the encoder. Decoders are configured with a network of modules to provide iterative decoding, i.e., with counterparts of the modules in the transmitter and its encoder. Turbo encoders and decoders are key elements in many communication systems and perform date reception with few errors. The basis of turbo coding can be thought of as introducing redundancy in the data to be transmitted through a channel that helps to recover the original data from the received data. A significant concern is the computation complexity of the iterative decoder, and there are continuing efforts to find a class of decoding algorithms that result in less complex hardware implementation, and specifically, there has been some efforts to at least provide a stopping criterion for use in determining the number of iterations that occur in the decoder, such as by providing a fixed or explicit number or threshold for iterations in the error-correcting loop. These efforts have not been entirely successful.

More specifically, recent developments in iterative decoding techniques based on turbo codes promise substantial gains over conventionally used partial response maximum likelihood detection methods in magnetic disk drive read channels. The main difficulties in incorporating iterative decoding systems in existing commercial products and similar designs are the complexity and the size of the decoder. Such iterative decoding systems have to be capable of performing at least two to five iterations in order to demonstrate significant coding gains. Hence, for an implementation to perform a fixed number of iterations ("v"), the hardware has to be duplicated v times or the effective throughput has to be reduced by v times. Neither of these implementation options appears acceptable given current trends in magnetic storage applications.

A multitude of proposals have been suggested for providing stopping criterion to provide a more practical iterative decoder implementation. One proposal involves the obvious solution of ending further iterations when a valid codeword has been determined. However, aside from the additional hardware that would be required to determine the validity of the codeword, such a stopping criterion leads to overcorrecting of the code. For example, by design, a Reed-Solomon decoder provided at the output of an iterative decoder system is capable of correcting erroneous bits when there are less than a particular number ("t") of error symbols. Hence, the output of the iterative decoder does not need to strictly error free as called for in this proposed implementation. Further, simple parity checking of convolutional codes is not an effective method as a large number of 2-bit and 4-bit error events cannot be detected.

Other proposed solutions generally employ some form of metric that monitors the evolution of Log Likelihood Ration (LLR) values, with LLR being the probability that the received data bit is a "0" divided by the probability that the received data bit is a "1." A comparison with a preset threshold that is selected based on either the absolute value, the polarity (i.e., signs), or mean of the LLR values determines if further iterations are required during decoding. Unfortunately, the evaluation of these metrics requires substantial amounts of additional hardware. Further, the threshold values are set through empirical methods, which impairs the theoretical analysis of error-correction performance at very low bit error rates (BERs). In general, stopping criteria that are based on a preset threshold need to be sufficiently conservative in order to avoid premature passing of an uncorrectable error to the outer Reed-Solomon decoder. Premature implies that the error would have become correctable by the Reed Solomon decoder had there been further iteration of the inner decoder. On the other hand, an overly conservative threshold may result in a high number of false alarms, effectively increasing the number of required iterations. These opposing factors present a difficult tradeoff, which is exacerbated in the event of applications requiring very low bit-error rates, such as a magnetic recording channel.

Hence, a need exists for an iterative decoder for use in communication channels, such as read channels of HDD systems and devices, that implements a stopping criterion (or stopping criterion generator or mechanism) to effective select a number of iterations performed during error correction by the decoder. Preferably, such a stopping criterion is selected such that its implementation can be performed with acceptable (e.g., negligible) added hardware in the decoder or communication channel while providing performance similar to or even identical to performance of an iterative loop system that performs the maximum number of iterations every time.

SUMMARY OF THE INVENTION

The present invention addresses the above problems by providing a method and associated circuitry or components for implementing error correction in an iterative decoder with an enhanced stopping criterion. In one exemplary embodiment, method of the invention involves providing an iterative loop in a decoder, such as a turbo code decoder or turbo decoder, that is operated in an iterative manner to correct errors introduced into an encoded message or stream of bits by noise or interference in a channel. After a first pass through the iterative loop, a stopping mechanism determines if additional iterations are necessary by determining a stopping criterion from an error location polynomial, comparing the stopping criterion to an iteration threshold, and proceeding with iterations when the stopping criterion is greater than the threshold. For example, the error location polynomial may be obtained from a Reed-Solomon (RS) decoder and the stopping criterion may be the degree of the error location polynomial. The threshold may be set to have a value representative of the error correcting capacity of the Reed-Solomon code implemented by the RS decoder, e.g., the maximum number of symbol errors correctable by the Reed-Solomon code. The method significantly reduces the number of iterations required, e.g., less than about 1.1 on average, for error-correcting message blocks while still obtaining results similar to or identical with decoder systems that perform the maximum number of iterations in the decoding loop.

More particularly, a decoder is provided for decoding a digital message transmitted over a communications channel that introduces error into the message. The decoder includes a decoding and error correction loop that iteratively processes a message that is encoded and then transmitted over a communication channel. In this regard, the decoder typically includes a channel detector detecting or receiving the encoded message. The decoding and error correction loop is configured to generate an error location polynomial as part of each iterative processing of the encoded message. The decoder further includes a stopping mechanism that allows an additional iteration of the message decoding or processing based on the error location polynomial. In some embodiments, the encoded message is encoded per a turbo code and the loop includes a decoder configured to run a decoding algorithm which results in production of the error location polynomial.

For example, a Reed-Solomon decoder may be provided in the decoder that produces an error location polynomial of a particular degree. In this example, the stopping mechanism obtains or ascertains the degree of this polynomial and compares it to a predetermined threshold to determine whether additional iterations should be performed by the decoding and error correction loop. In one such decoder, the threshold is the maximum number of symbol errors correctable by the Reed-Solomon code embodied in the Reed-Solomon decoder (e.g., the value of t in a (n,k,t) Reed-Solomon code) and the stopping mechanism allows further iterations when the stopping criterion (i.e., the degree of the error location polynomial) is greater than the maximum number of symbol errors correctable by the Reed-Solomon code (or in other words, in this particular example, the stopping mechanism halts iterations when the stopping criterion is less than or equal to the threshold value).

DETAILED DESCRIPTION OF THE PREFERRED EMBODIMENTS

Briefly, the present invention is directed to an error correction method, and associated circuitry and devices, for use in decoders in communication channels such as read or read/write channel in a hard disk drive (HDD) system. In one embodiment, the inventive method and system uses partial results from an outer Reed-Solomon decoder module in a communication channel (e.g., HDD read channel) decoder to determine if the decoder reiterates a decoding operation. The inventors have determined that a decoder that performs a maximum of 3 decoding iterations only performs on average less than about 1.1 iterations when implementing the stopping criterion of the present invention. Accordingly, only 1 in 10 sectors require 2 iterations and only 1 in 500,000 sectors of a hard disk require 3 iterations. Using a combination of queuing theory and stochastic analysis, a feasible hardware implementation of the iterative error correction method can be provided in a decoder system or device (such as an IC) using addition FIFO buffers and can be operated with an insignificant frequency overhead of less than about ten percent.

Figure 1:
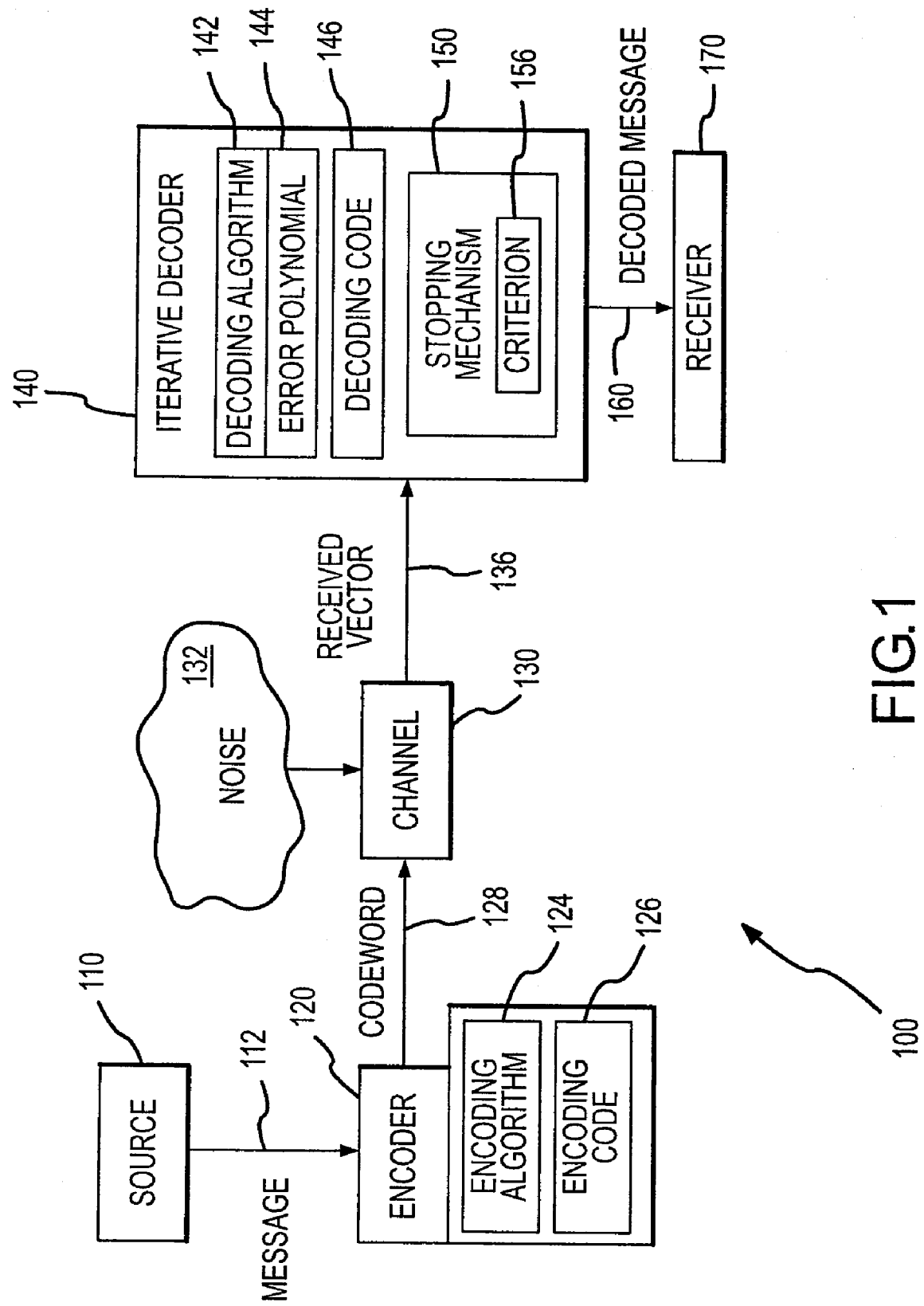
FIG. 1 is a functional block diagram of a communication system with a stopping mechanism according to the present invention.

FIG. 1 illustrates in functional block form a digital communication system 100 according to one embodiment of the invention that is useful for correcting errors in a received vector (or in received data) 136 with an iterative decoder 140. In the communication system 100, error-correcting codes (shown as encoding code 126 in encoder 120 and decoding code 146 of decoder 140) are used to send messages over a noisy channel 130. For example, the error-correcting code may be a turbo code that introduces redundancy in the transmitted data 128, and hence, the encoder 120 and decoder 140 may include turbo encoders and decoders to practice the invention. As shown, a message 112 is given by the source 110 to the encoder 120 that may be considered a transmitter that provides channel coding and modulation. The encoder 120 includes an encoding algorithm 124 (e.g., the Reed Solomon (RS) code) that encodes the message 112 into a codeword 128, e.g., a message with controlled redundancy in the binary information to assist in overcoming effects of noise/interference 132 that may be encountered in the channel 130. For example, the codeword 128 may be a string of letters from some alphabet that is selected based on the code 126.

The encoded message 128 is sent through the channel 130, where it may be subjected to error-introducing noise 132 that causes the message to be altered into a transmitted or received vector (message or data) 136. When this message 136 arrives at the iterative decoder 140 (which may include a demodulator (not shown) to demodulate the message into a sequence of discrete data symbols that can be processed to regenerate the original information sequence) belonging to the receiver 170, it is equated with the most likely codeword, i.e., the one that in a probabilistic sense depending on the channel 130 was probably sent. The iterative decoder 140 employs a decoding algorithm 142 (e.g., an RS code) to decode the received codeword and pass the decoded message 160 to the receiver 170. The decoding algorithm 142 is repeated (or portions are repeated) a number of iterations to achieve the desired error-correction. The performance of the decoder 140 is often measured by the average probability of bit errors, which is referred to as bit error rate (BER).

A stopping mechanism 150 is provided according to the invention to determine the number of iterations of the decoding algorithm to perform to correct errors. The number of iterations is determined based on a stopping criterion 156 that is determined by the stopping mechanism 150 based on the error location polynomial 144 generated by the decoding algorithm. As will become clear with a full description with reference to FIG. 3, the decoding algorithm 144 may be a Reed-Solomon code-based decoding algorithm (or a network of modules providing error correction) that evaluates an error location polynomial 144 as part of the decoding algorithm 142. The stopping criterion 156 may be determined by the stopping mechanism 150 based on the error location polynomial 144, such as by finding the degree of the polynomial. The decision on whether to perform additional iterations or to stop is made by comparing the error location polynomial degree to a particular value or threshold, such as "t" for decoding algorithm built based on a (n,k,t) Reed-Solomon code. In this example, the decoder 140 reiterates the decoding if the degree of the error location polynomial 144 is larger than t. In this manner, the iterative decoder 140 only performs the number of iterations that are necessary to achieve proper error correction as further iterations are terminated as soon as the decoding algorithm 142 (or the RS decoder module (not shown in FIG. 1)) is able to correct the errors in the received vector or message 136.

Figure 2:
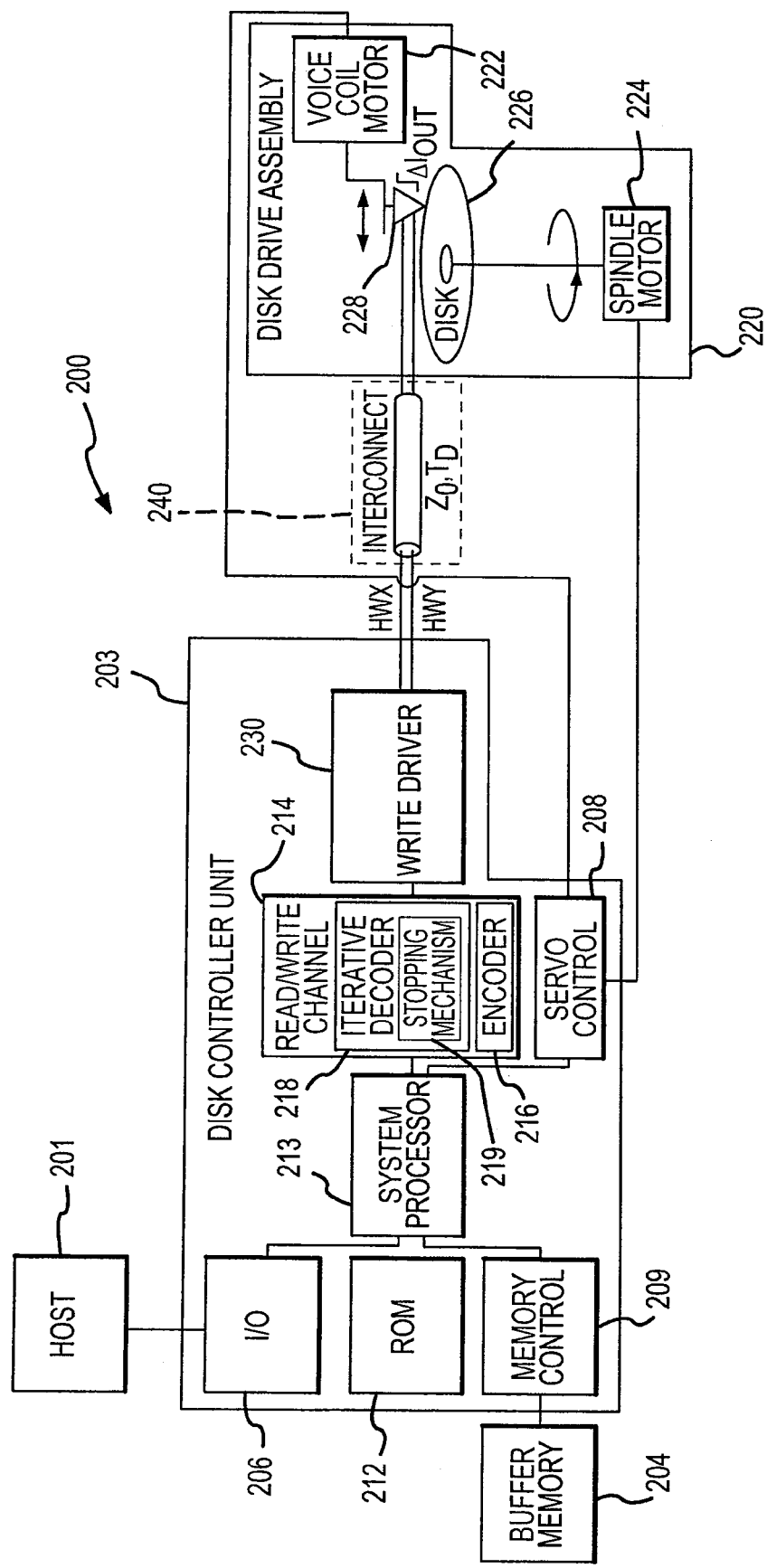
FIG. 2 illustrates in block diagram form a hard disk drive (HDD) system according to an embodiment of the invention shown to include a read/write channel with an iterative decoder using a stopping mechanism to determine iterations.
Figure 3:
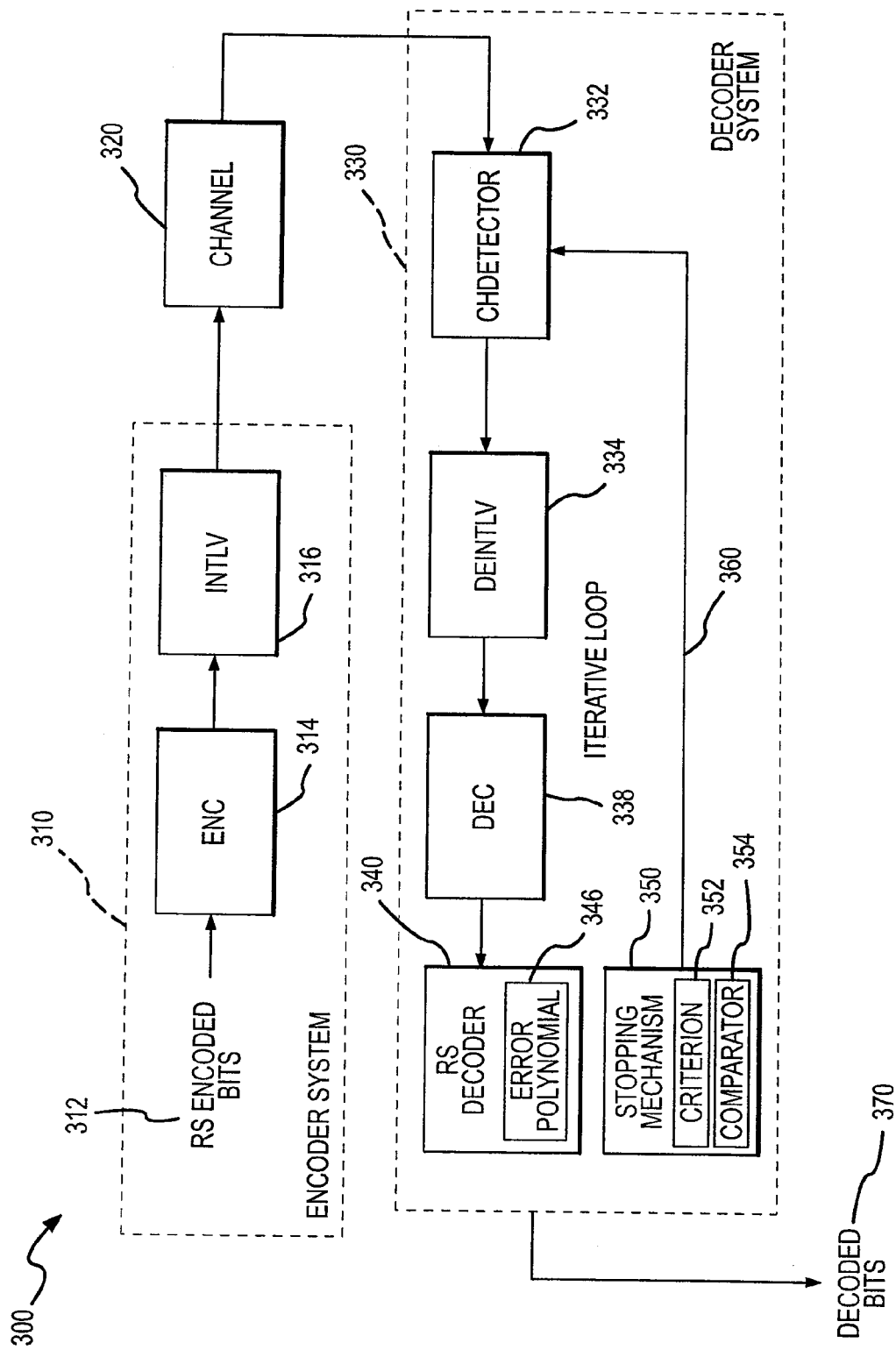
FIG. 3 shows another communication system with an iterative decoder according to the present invention.

FIG. 2 illustrates in simplified form a hard disk drive system 200 in which the present invention is embodied. It should be understood that the error correction techniques of the invention can be used in nearly any hard disk drive assembly configuration and, further, are not even limited to use in hard disk assemblies but can be used as shown in FIGS. 1 and 3 in other communication systems employing an iterative decoder to decode an encoded message or data. As shown, disk drive system 200 includes a system processor 213 processing requests and commands from a host computer 201 that directs drive system 200 to perform specific behavior involving disk drive assembly 220. Examples include reading and writing data to disk drive assembly 220 (which results in a need for decoding with error correction according to the techniques of the invention as described in detail below with reference to FIG. 3), providing state information such as defect tables, error status, and the like. Disk controller unit 203 includes data processing capacity as well as memory in the form of ROM 212 and buffer memory 204 to generate responses to received commands and requests as controlled by memory control 209. The generated responses return data, state information, and/or error codes depending on the particular operation being performed.

Disk drive system 200 implements physical mass storage typically on a plurality of magnetic disks and read/write head electronics for transferring data with the disks. As shown, disk drive system 200 includes read channel hardware 214 for preprocessing including decoding and amplifying data read from the magnetic media as well as a spin motor 224 for spinning the disks, and voice coil motor (VCM) 222 for positioning the read/write head electronics at specific locations with respect to the disk surface(s). Servo control 208 generates drive signals that control the VCM 222 and/or spindle motor 224. These drive signals are in the form of precision higher power signals that drive the motors directly.

Host 201 typically comprises a data processing device such as a personal computer, server, workstation or the like that requires access to bulk data storage capabilities of disk drive assembly 220. Host 201 sends write commands and data via controller 203 to write data onto the disk(s) 226 as well as read commands to retrieve previously written data from disks within disk drive assembly 220. The read and write commands are provided via the read/write channel 205. On both read and write operations, the data transmitted from the host 201 to the disk controller 203 includes an indication of a specific location or set of locations on the disk drive assembly 220 that contains the data that is to be accessed.

The data that is exchanged through disk controller 203 is typically buffered in buffer memory 304 that is accessible via memory controller 209 and subsequently transmitted to disk assembly 220 or host 201. Buffer memory 204 is used to overcome differences between the speed at which host 201 operates as compared to the speed at which disk assembly 220 operates. In place of or in addition to buffer memory 204, a cache memory may be implemented by appropriate changes (e.g., tag management, hit/miss detection, and the like) to memory controller 209. Servo control 208 regulates the spin speed of spindle motor 224 in response to commands from system processor 213. Although a head position control unit is often provided, the servo control 208 is shown to operate, e.g., through a voltage mode driver (not shown), to deliver controlled voltage signals in response to commands from system processor 213 to voice coil motor 222. These voltage signals cause voice coil motor unit 222 to move read/write head 228 into precision alignment with respect to the surfaces of disk 226.

Read/write channel circuit 205 communicates data and control information with the surface of disk 226. Control information such as servo control data, phase lock oscillator synchronization patterns, and servo bursts are encoded into portions of disk 326. This information is provided through read/write channel circuit 205 to system processor 213. System processor 213 uses this information to compute commands for servo control 208. The read/write head 228 comprises an MR head that is used to both record user data to and read user data back from the disk 226. Recording data or writing by the head 228 is controlled in part by the write driver 230 that functions to drive a current through a coil in the head.

According to the present invention, the read/write channel 214 includes an encoder 216, such as a turbo encoder and an RS-based encoder or the like, is used to encode information, such as with controlled redundancy, prior to its writing by via write head on the disk 226. Significantly, the read/write channel 214 also includes an iterative decoder 218, such as a turbo decoder and an RS decoder, and in some embodiments, the read/write channel 214 may be presented as separate components, e.g., with a separate read channel(s) with associated decoder(s) and write channel with associated encoder. The channel 130 of FIG. 1 that imparts noise and/or interference into an encoded message may be considered the portions of the system 200 between the write channel 214 and the read channel 214, such as the write driver 230, interconnect 240, head 228, and disk 226.

To correct errors that are imparted in this "channel" of system 200, the read/write channel 214 includes an iterative decoder 218 that repeats or iterates a number of modules or portions of a decoding algorithm (see, for example, the iterative decoder 330 of FIG. 3) until a stopping mechanism 219 determines no further iterations are necessary to address the errors. The stopping mechanism 219 as discussed with reference to FIG. 1 generally acts to determine a stopping criterion based on an error location polynomial generated by the iterative decoder 218. More specifically, in one embodiment, the stopping mechanism 219 acts to determine a degree of an error location polynomial produced by an RS decoder module in the iterative decoder 218, compares the determined polynomial degree with a threshold value, such as the value of "t" of a (n,k,t) Reed-Solomon code, and continues iterations when the polynomial degree is greater than t. Otherwise, iterations are halted by the stopping mechanism 219 and the decoded message or data is transmitted to the receiver (e.g., the host 201 via system processor 213 and I/O 206).

FIG. 3 illustrates a digital communication system 300 utilizing the dynamically-generated stopping criterion of the present invention to determine how many error-correcting iterations to perform in a decoder. The communication system 300 may have many implementations including, but not limited to use as an encoder/decoder pair in a magnetic storage device such as a HDD assembly or the like. Generally, in such a decoder/encoder pair, an encoder system 310 is provided that takes a data stream or message from a source (not shown in FIG. 3) and encodes the message according to a particular code, e.g., a turbo code that adds controlled redundancy. The encoded message is transmitted through a channel 320 (such as electronic and transmission components and storage media of an HDD assembly) where noise and interference may alter the encoded message. The altered or error-containing message is then read or received by a decoder system 330, which includes a number of or network of modules that act as counterparts to the encoder system 310 by functioning to decode the message from the channel 320 and to also perform error-correcting functions. The decoded message 370 is then passed from the decoder system 330 to a downstream component or receiver (not shown in FIG. 3).

Returning to the top architectural view of the system 300 in FIG. 3, encoded bit 312 enter the encoder system 310. In one embodiment, the bits 312 are encoded as RS encoded bits. The encoded bits 312 enter an encoder 314, which may take the form of a convolutional encoder or the like. Outputs from the encoder 314 are interleaved by interleaver 316 prior to transmission onto channel 320, e.g., prior to writing onto magnetic storage media such as the disk 226 shown in FIG. 2.

The interleaver 316 produces a permuted version of the input symbols or encoded message from the encoder 314.

In the decoder system 330, a channel detector 332 detects and receives the encoded and potentially error-inclusive message from the channel 320. The message is passed to a deinterleaver 334 (i.e., the counterpart of the interleaver 316) which processes the message and passes the message to decoder 338 (i.e., the counterpart of encoder 314). The output from the decoder 338 is passed to the RS decoder 340 for further processing, which includes generation of an error location polynomial 346 (i.e., an error location polynomial of a particular degree). The channel detector 332, deinterleaver 334, decoder 338, and RS decoder 340 make up an iterative loop (shown by arrow 360) that is repeated a variable number of iterations to provide desired error correction by the iterative loop modules and particularly the RS decoder 340. The decoded bits or message 370 is output after the iteration loop 360 is halted, e.g., the decoded and error-corrected message 370 is sent to a receiver (not shown in FIG. 3) such as a receiver 170 as shown in FIG. 1 or a requesting host 201 as shown in FIG. 2 or the like.

The iterative loop 360 is repeated until it is determined by a stopping mechanism 350 that further error correction is not desired (e.g., is not needed or is not productive) based on a stopping criterion 352. Significantly, the stopping criterion 352 is generated by the stopping mechanism 350 based on the error location polynomial 346 obtained from the Reed-Solomon decoder 340, and error location polynomial-based stopping criterion 350 is compared with a comparator 354 or other techniques to a selected value or threshold to determine if addition iterations of the loop 360 should be performed. In one preferred embodiment, the stopping rule implemented by the stopping mechanism 350 involves checking or determining the degree of the error location polynomial 346 evaluated by the RS decoder 340. By design, a (n,k,t) Reed-Solomon code can correct a maximum of t symbol errors. Using Berlekamp's decoding algorithm, the error location polynomial 346 can be determined by the RS decoder 340 in 2t cycles. The stopping mechanism 350 then compares the criterion 352 to the maximum number of symbol error corrections t to determine whether the system 330 should reiterate decoding. In one specific embodiment, the decoder system 330 reiterates the decoding when the error location polynomial degree is larger than t.

With the operation of exemplary decoders understood, the following discussion provides more details on the types of results that the inventors expect to be obtained by implementation of this stopping criterion or stopping rules in an iterative decoder and also further explanation of how the stopping criterion can be effectively implemented in practice.

The inventors performed a simulation of the use of the stopping criterion of the invention and obtained results indicating that the average number of iterations required using the proposed rule is less than 1.1. In the simulation, the following assumptions and components/configurations were used: a perpendicular channel with Erf pulse; a channel density, Dc=2.25; 90 percent jitter noise; a pseudo-random interleaver; one sector has 1 KB (kilobyte) and is encoded by a convolutional code; and the error correction code (ECC) was assumed to have the capability to correct 40 symbol errors. With these assumed values and components, the following simulation results were obtained.

At a signal to noise ratio (SNR)=10.5 and total blocks simulated=1060000:
Number of blocks that need 1 iteration=940383;
Number of blocks that need 2 iterations=119615;
Number of blocks that need 3 iterations=2;

Producing an Average Iteration Number=1.112.
At SNR=10.75 and total blocks simulated=760000:
Number of blocks that need 1 iteration=754754;
Number of blocks that need 2 iterations=5246;
Producing an Average Iteration Number=1.0069.
At SNR=11 and total blocks simulated=1290000:
Number of blocks that need 1 iteration=1289809;
Number of blocks that need 2 iterations=191;
Producing an Average Iteration Number=1.000156.

As can be seen, the average number of iterations is below 1.1, and this allows a decoder system to be implemented with marginal frequency overhead of only 10 percent. Further, in contrast to many other stopping criterion techniques, the amount of additional hardware (when compared to iterative decoders without an explicit stopping criterion) used to implement the invention (such as those shown in FIGS. 1-3) is negligible. This is due in part because the stopping criterion method takes advantage of the fact that existing magnetic storage system implement a Reed-Solomon (RS) decoder that is concatenated with the read channel detector. All or nearly all RS decoders evaluate an error location polynomial as part of their decoding algorithm, and the stopping criterion method described herein conveniently employs this error location polynomial to determine whether to reiterate the inner decoding of the iterative decoder.

Another advantage of the stopping criterion method of the invention is that it produces identical or nearly identical performance as a system that performs the maximum number of iterations every time and at a fraction of the cost of existing iterative decoding systems. There is no necessity to evaluate the heuristics of a given system in order to determine the optimal value of a certain metric threshold, and degradation of results, which is a common artifact of other stopping criteria, is avoided.

The number of iterations performed by a decoder system implementing a stopping mechanism of the invention is no more than is necessary to achieve error correction. For example, as long as the Reed-Solomon decoder is able to correct the errors in message received over a noisy channel further iterations are terminated, and this property of the inventive decoder systems is not present in prior decoders and iterative decoder systems. Traditionally, the number of iterations performed by iterative decoding systems is determined through a difficult tradeoff between area, speed, and maximum number of iterations, which affects the performance of the error-correcting code (ECC). By implementing the stopping criterion methods described herein, the number of blocks requiring more than two iterations is reduced dramatically, and consequently, the maximum number of iterations no longer plays a significant role in design considerations for a hardware implementation of an iterative decoder configured to implement the stopping criterion technique of the present invention.

The following discussion provides a further discussion of error detection of Reed-Solomon codes and implementation issues (such as latency and power consumption) involved with reiteration decoding (such as reiteration of Recursive Systematic Ordinary Convolution (RSOC) codes or other useful iterative code-based read channel). Initially, it may be useful to further describe Reed-Solomon codes and the probability of undetected errors. A q-ary (n,k) Reed-Solomon code with error correction capability t has the following properties: block length of n; number of redundant symbols of n−k=2t; minimum distance of $d_{min}$=2t+1; and the symbols of the codes are from GF(q), usually $q=2^m$. The weight distribution of the code is given $$A_i = \binom{n}{i} \cdot \left\{ \sum_{j=0}^{i-d} (-1)^j \binom{i}{j} q^{i-j+1-d} + \sum_{j=i-d+1}^{i} (-1)^j \binom{i}{j} \right\}. \quad (1)$$

by Eq. (1):

In Eq. (1), d≦i≦n and $A_i$ is the number of codewords of weight i and $d=d_{min}$.

Eq. (2) provides the probability of an undetected error when a q-ary (n,k) Reed-Solomon codeword C is transmitted over a discrete memoryless channel and it $$P_{ud}(C, \varepsilon) = \sum_{i=d_{min}}^{n} A_i \left(\frac{\varepsilon}{q-1}\right)^i (1-\varepsilon)^{n-i}. \quad (2)$$

is assumed that the symbol-error probability is ε.

If the symbol-error probability ε satisfies 0≦ε≦(q−1)/q, then the probability of undetected error is bounded by Eq. (3):

$$P_{ud}(C, \varepsilon) = \sum_{i=d_{min}}^{n} A_i \left(\frac{\varepsilon}{q-1}\right)^i (1-\varepsilon)^{n-i} < q^{-(n-k)}. \quad (3)$$

Consider a typical Reed-Solomon code with the following parameters: 10 bits per symbol; $q=2^{(10)}=1024$; t=20; n−k=2t=40. Then, from Eq. (3), we have:

$$P_{ud}(C,\varepsilon) < q^{-(n-k)} = 1024^{-40} < 10^{-120}. \quad (4)$$

Please note that the iterative-code read channel is approximately discrete memoryless due to the existence of pseudorandom interleaving. Usually, the symbol-error probability of an operational read channel satisfies 0≦ε≦(q−1)/q. Hence, the probability of undetected error for a read channel coded by a Reed-Solomon code with parameters above is way below the targeted sector failure rate.

Now, it may be useful to discuss the feasibility of reiteration of iteration codes with particular attention given to stopping criterion for iterations according to embodiments of the present invention. At the end of each iteration, the hard decision of the data block may be fed to the Reed-Solomon decoder using Berlekamp's decoding algorithm. An important feature of Berlekamp's decoding algorithm is that if the number of symbol errors is not greater than t, the designed error correction capability, then in at most 2t steps, an error location polynomial with degree of at most t can be found.

The above statement means that if the error location polynomial has a degree greater than t after 2t steps, then the number of error symbols must be greater than t. This feature, and understanding of such a feature, can be used as an effective stopping criterion for the iterations of iteration-code read channel. Toward the goal of generating a stopping criterion, at the end of each iteration, the Reed-Solomon decoder finds an error location polynomial using Berlekamp's algorithm. After at most 2t steps, an error location polynomial is found that satisfies the generalized Newton's identities. Then, the degree of the error location polynomial is checked to determine if the degree of the polynomial is at most t, and if so, the error pattern can be corrected by the Reed-Solomon code and iterations can be stopped. Otherwise, iterations should continue to provide desirable error correction.

As can be seen, the use of such a stopping criterion provide low latency in flagging a reiteration. Specifically, once the syndrome computation is finished, the process needs at most 2t steps to get the error location polynomial. Since the syndrome computation can be implemented on the fly, and the latency for the Reed-Solomon decoder to feedback a stopping flag is L+Δ+2t, where L is the length of the sector, Δ is the total latency of the channel detector, the interleaving, and the iterative code (e.g., RSOC or the like) decoding.

The use of a stopping criterion generated from the error location polynomial also results in lower power being required for iterative decoding. During operations in the SNR range of a read channel, the probability of reiteration is quite small. Simulation results achieved by the inventors have shown that the probability of reiteration is below $10^{-4}$ or even below $10^{-6}$, which shows that the extra power required for reiteration is negligible.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention as hereinafter claimed.

The invention provides a new stopping criterion for iterative decoding that is particularly well-suited for use in read channel applications of HDD assemblies. It reduces the average number of iterations dramatically while providing the performance of an iterative decoder system with significantly higher numbers of iterations. As a result, the hardware implementation does not have to put up with the traditionally difficult tradeoff considerations between coding gain, area, and frequency.

We claim:

1. A decoder for decoding a digital message transmitted over a channel using fewer decoding iterations to achieve error correction, comprising:
   a decoding and error correction loop iteratively processing a message encoded and transmitted over a communication channel, the decoding and error correction loop generating an error location polynomial during each of the iterative processing of the encoded message; and
   a stopping mechanism determines whether the degree of the error location polynomial is less than or equal to a predetermined threshold value, wherein the stopping mechanism terminates iteration when the degree of the error location polynomial is less than or equal to a predetermined threshold value.

2. The decoder of claim 1, wherein the predetermined threshold value is a maximum number of symbol errors correctable by a Reed-Solomon code.

3. The decoder of claim 2, wherein the Reed Solomon code comprises Berklekamp's decoding algorithm.

4. The decoder of claim 1, wherein the channel comprises read channels for a hard disk drive.

5. The decoder of claim 1, wherein the encoded message is encoded based on a concatenation coding scheme in which a user message is first encoded by an outer error correction code (ECC) and second encoded by an inner ECC, and further wherein the error location polynomial is generated by a decoding algorithm of the outer ECC.

6. The decoder of claim 1, wherein the outer ECC comprises a Reed-Solomon code or a BCH code.

7. The decoder of claim 6, wherein the decoding and error correction loop comprises a full or partial Reed-Solomon decoder capable of generating the error location polynomial.

8. The decoder of claim 1, wherein the inner ECC comprises a turbo code, a low density parity check (LDPC) code, a single convolutional code, or a turbo product code (TPC).

9. A hard disk drive configured to implement a stopping criterion to control error correction iterations, comprising:
   a concatenation encoder first encoding a digital message with an outer error correction code (ECC) and second encoding the digital message from the outer ECC with an inner ECC;
   a channel transmitting the encoded message, the channel having noise or interference that alters the encoded message by introducing error; and
   a decoder system detecting the altered encoded message on the channel and decoding the altered encoded message in an iterative manner including at least partially correcting the introduced error, the decoder system comprising an inner decoder configured with a decoding algorithm based on the inner ECC, an outer decoder configured with a decoding algorithm based on the outer ECC, and a stopping mechanism terminating the decoding of the altered encoded message based on an error location polynomial generated by the outer ECC, wherein the stopping mechanism determines whether the degree of the error location polynomial is less than or equal to a predetermined threshold value.

10. The hard disk drive of claim 9, wherein the stopping mechanism terminates iteration when the degree of the error location polynomial is less than or equal to a predetermined threshold value.

11. The hard disk drive of claim 10, wherein the threshold is the maximum number of symbol errors correctable by the Reed-Solomon decoder.

12. The hard disk drive of claim 9, wherein the predetermined threshold value is the maximum number of symbol errors correctable by the Reed-Solomon code.

13. The hard disk drive of claim 9, wherein the Reed Solomon code comprises Berklekamp's decoding algorithm.

14. The hard disk drive of claim 9, wherein the outer ECC is a Reed-Solomon code or a BCH code and the outer decoder generates the error location polynomial with a particular degree in a finite number of steps.

15. The hard disk drive of claim 9, wherein the decoder system further comprises a channel detector in communication with the channel, an inner decoder decoding an output sequence of the channel detector, a deinterleaver/interleaver interposed between the channel detector and inner decoder when the inner decoder uses a turbo code or a single convolutional code and wherein the outer decoder decoding the output sequence of the inner decoder, the channel detector, the inner decoder, and the outer decoder form an iterative loop through which the altered encoded message is passed for the decoding until iterations are halted by the stopping mechanism.

16. An error correction method for use with encoded digital messages transmitted over a noisy communication channel in a communication system, comprising:
   receiving an encoded message from a communication channel in the communication system;
   decoding the encoded message in the communication system;
   determining an error location polynomial based on the decoding of the encoded message in the communication system;
   obtaining a stopping criterion from the error location polynomial in the communication system;

comparing the stopping criterion of the error location polynomial with a threshold in the communication system; and repeating the decoding, the determining of the error location polynomial, the obtaining of the stopping criterion, and the comparing of the degree of the error location polynomial with the threshold until the comparing indicates the stopping criterion is satisfied, wherein the stopping criterion determines whether the degree of the error location polynomial is less than or equal to a predetermined threshold value in the communication system.

17. The error correction method of claim 16, wherein the predetermined threshold is a maximum number of symbol errors correctable by the Reed-Solomon code.

18. The error correction method of claim 16, wherein the stopping criterion is satisfied when the error location polynomial is less than or equal to the threshold value.

19. The error correction method of claim 16, wherein the decoding comprises processing the encoded message with a deinterleaver and then with a decoder module being a counterpart to an encoder used to encode the encoded message.

20. The error correction method of claim 19, wherein the encoded message comprises Reed-Solomon encoded bits that are processed by the encoder and by an interleaver.

21. The error correction method of claim 16, wherein the communication system is implemented in a magnetic storage device.

* * * * *